United States Patent
Kadowaki et al.

(10) Patent No.: US 9,960,010 B2
(45) Date of Patent: May 1, 2018

(54) SIGNAL PROCESSING METHOD AND SIGNAL PROCESSING APPARATUS

(75) Inventors: Motoki Kadowaki, Yokkaichi (JP); Osamu Nagano, Kuwana (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 1481 days.

(21) Appl. No.: 13/601,303

(22) Filed: Aug. 31, 2012

(65) Prior Publication Data

US 2013/0245989 A1 Sep. 19, 2013

(30) Foreign Application Priority Data

Dec. 26, 2011 (JP) ................................. 2011-284115

(51) Int. Cl.
*H01J 37/26* (2006.01)
*H01J 37/22* (2006.01)
*H01J 37/28* (2006.01)

(52) U.S. Cl.
CPC .......... *H01J 37/261* (2013.01); *H01J 37/222* (2013.01); *H01J 37/28* (2013.01); *H01J 2237/245* (2013.01); *H01J 2237/24465* (2013.01); *H01J 2237/24485* (2013.01); *H01J 2237/2817* (2013.01)

(58) Field of Classification Search
CPC ........ H01J 37/261; H01J 37/222; H01J 37/28; H01J 2237/24465; H01J 2237/24485; H01J 2237/245; H01J 2237/2817
USPC ...................................................... 702/150
See application file for complete search history.

(56) References Cited

U.S. PATENT DOCUMENTS 6,265,719 B1 7/2001 Yamazaki et al.
2002/0036264 A1* 3/2002 Nakasuji ............... G01N 23/225
                                                                250/306
2011/0255773 A1 10/2011 Takahashi et al.
(Continued)

FOREIGN PATENT DOCUMENTS

JP        6-243814      9/1994
JP       11-132975      5/1999
JP     2002-141015      5/2002
(Continued)

OTHER PUBLICATIONS

Office Action dated Mar. 20, 2015 in Japanese Patent Application No. 2011-284115 (with English language translation).
(Continued)

*Primary Examiner* — Michael Nghiem
*Assistant Examiner* — Peter Ngo
(74) *Attorney, Agent, or Firm* — Oblon, McClelland, Maier & Neustadt, L.L.P.

(57) ABSTRACT

In accordance with an embodiment, a signal processing method includes scanning a pattern on a substrate with a charged particle beam, detecting secondary charged particles emitted from the substrate by using a detector, outputting a signal, and filtering the signal. The detector is separated or divided into a plurality of regions, and the secondary charged particles are detected separately in each region of the detector. Intensity of the filtering is defined in dependence on a function $f(\theta)$ of an angle $\theta$ between a reference axis and a direction along which the secondary charged particles enter a detector plane. The reference axis is an arbitrary direction in a plane parallel to a surface of the substrate.

4 Claims, 16 Drawing Sheets

(56) References Cited

U.S. PATENT DOCUMENTS

2012/0243770 A1* 9/2012 Kaneko .............. G01N 21/9501
                                                    382/141
2012/0274757 A1* 11/2012 Bai ....................... H01J 37/244
                                                    348/79

FOREIGN PATENT DOCUMENTS

| JP | 2005-37291 |   | 2/2005 | |
|----|------------|---|--------|---|
| JP | 2010-103322 |  | 5/2010 | |
| JP | 2011119446 | * | 6/2011 | ............ H01J 37/244 |

OTHER PUBLICATIONS

Japanese Office Action dated Sep. 12, 2014 in Patent Application No. 2011-284115 with English Translation.

* cited by examiner

19keV ≦ E < 25keV        E < 19keV (1+6+4+5+2+2+6+7+8+5+1+3+6+4+0)/15=4

| 1 | 6 | 4 | 5 | 2 |
| 2 | 6 | 7 | 8 | 5 |
| 1 | 3 | 6 | 4 | 0 |

0 2 4 4 5 5 6 7 8

| 4 | 5 | 2 |
| 7 | 8 | 5 |
| 6 | 4 | 0 |

(1+2+1)/3≒1   5   6   6   2

US 9,960,010 B2

SIGNAL PROCESSING METHOD AND SIGNAL PROCESSING APPARATUS

CROSS REFERENCE TO RELATED APPLICATIONS

This application is based upon and claims the benefit of priority from the prior Japanese Patent Application No. 2011-284115, filed on Dec. 26, 2011, the entire contents of which are incorporated herein by reference.

FIELD

Embodiments described herein relate generally to a signal processing method and a signal processing apparatus.

BACKGROUND

In a manufacturing process of a semiconductor apparatus, a pattern on a wafer is observed using an apparatus adopting, e.g., a Scanning Electron Microscope (which will be appropriately referred to as "SEM" hereinafter) system, a defect is detected, or a pattern dimension is measured. However, in most conventional SEMs, since secondary electrons from a pattern are mainly detected to form an image, there is almost no secondary electron discharged from the pattern beyond a top face of a pattern as an observation target when an aspect ratio of the pattern is as high as, e.g., above 10, and hence detecting a signal itself is difficult. Therefore, a defect that is present in a pattern having a high aspect ratio cannot be detected, and observation and metrology are also impossible.

DETAILED DESCRIPTION

In accordance with an embodiment, a signal processing method includes scanning a pattern on a substrate with a charged particle beam, detecting secondary charged particles emitted from the substrate by using a detector, outputting a signal, and filtering the signal. The detector is separated or divided into a plurality of regions, and the secondary charged particles are detected separately in each region of the detector. Intensity of the filtering is defined in dependence on a function $f(\theta)$ of an angle $\theta$ between a reference axis and a direction along which the secondary charged particles enter a detector plane. The reference axis is an arbitrary direction in a plane parallel to a surface of the substrate.

Embodiments will now be explained with reference to the accompanying drawings. Like components are provided with like reference signs throughout the drawings and repeated descriptions thereof are appropriately omitted.

(1) Signal Processing Apparatus According to Embodiment 1

Figure 1:
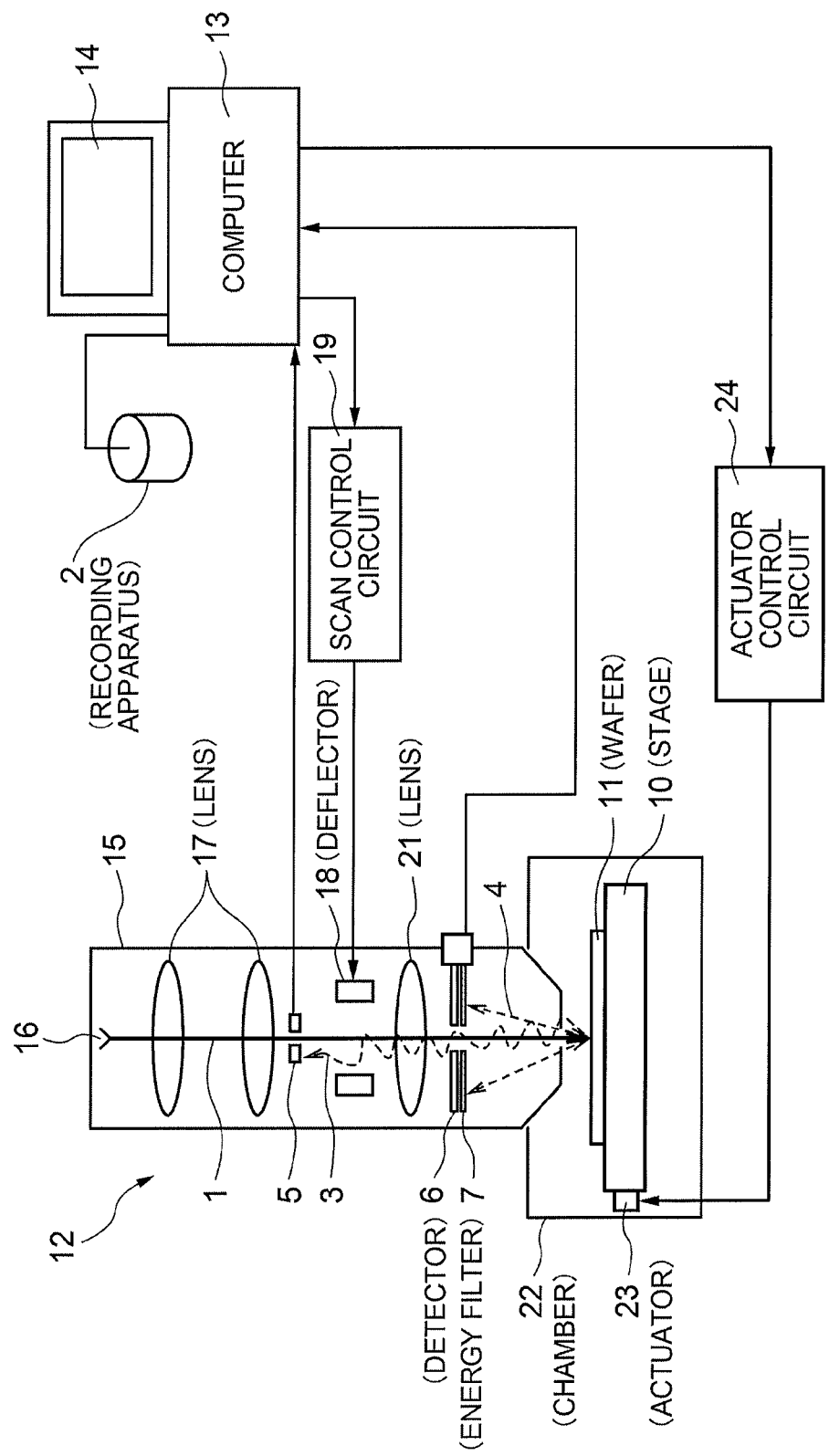
FIG. 1 is a block diagram showing an outline configuration of a signal processing apparatus according to Embodiment 1.

FIG. 1 is a block diagram showing an outline configuration of a signal processing apparatus according to Embodiment 1. The signal processing apparatus shown in FIG. 1 includes a scanning electron microscope 12, a computer 13, a scan control circuit 19, an actuator control circuit 24, a monitor 14, and a recording apparatus 2. The scanning electron microscope 12 includes a column 15 and a specimen chamber 22, and an electron gun 16, a condenser lens 17, a deflector 18, an objective lens 21, and detectors 5 and 6 which are characteristic in this embodiment. In this embodiment, the detector 5 is provided between the condenser lens 17 and the deflector 18, and the detector 6 is provided between the objective lens 21 and a wafer 11. Specific configurations of the detectors 5 and 6 will be described later in detail. A stage 10 and an actuator 23 are provided in the specimen chamber 22. The stage 10 supports the wafer 11 having an inspection target pattern formed thereon. In this embodiment, the electron gun 16 corresponds to, e.g., a charged particle source, and the wafer 11 corresponds to, e.g., a substrate. The substrate is not restricted to a wafer, and it may be, e.g., a glass substrate or a ceramic substrate as long as a pattern is formed thereon.

A computer 13 is connected to the scan control circuit 19, the detectors 5 and 6, an energy filter 7, and the actuator control circuit 24. The scan control circuit 19 is connected to the deflector 18 in the column 15, and the actuator control circuit 24 is connected to the actuator 23 in the specimen chamber 22. Further, the computer 13 is also connected to a monitor 14 and a recording apparatus 2. An electron beam 1 emitted from the electron gun 16 is condensed by the condenser lens 17, then a focal position is adjusted by the objective lens 21, and the wafer 11 is irradiated with the electron beam 1. The scan control circuit 19 generates a control signal in accordance with an instruction from the computer 13, and the deflector 18 forms a deflection electric field or a deflection magnetic field based on the control signal supplied from the scan control circuit 19, appropriately deflects the electron beam 1 in an X direction and a Y direction, and scans a surface of the wafer 11. When the electron beam 1 is applied, secondary electrons 3 having relatively low energy and reflected electrons 4 having relative high energy are generated from the surface of the wafer 11. The secondary electrons 3 are mainly detected by the detector 5, the reflected electrons 4 are detected by the detector 6, and a detection signal is supplied to the computer 13. At this time, if the computer 13 generates the control signal, a predetermined voltage is applied to the energy filter 7, and the reflected electrons 4 reaching the detector 6 are filtered in accordance with the energy. In this embodiment, the secondary electrons and the reflected electrons correspond to, e.g., charged particles, and the energy filter 7 and the detectors 5 and 6 correspond to, e.g., a detection unit. The computer 13 processes the detection signals supplied from the detectors 5 and 6, forms an image of a pattern (an SEM image) on the surface of the wafer 11, and displays the image in the monitor 14. The stage 10 can move in the X direction and the Y direction, and it moves in the X direction and the Y direction when the actuator 23 drives in accordance with a control signal generated by the actuator control circuit 24 in response to an instruction from the computer 13. The stage 10 may be configured to be movable not only in a two-dimensional plane of X-Y but also in arbitrary directions of X, Y, and Z in a three-dimensional space in accordance with an inspection target pattern. The recording apparatus 2 stores, e.g., S/N values of defective portions calculated from the inspection target pattern as well as reference S/N data for measurement of a depth of a defect and others. The computer 13 takes in such data from the recording apparatus 2 and performs arithmetic processing such as comparison or analysis of the S/N values. In this embodiment, the deflector 18, the scan control circuit 19, the stage 10, the actuator 23, the actuator control circuit 24, and the computer 13 correspond to, e.g., a scan unit. Furthermore, in this embodiment, the computer 13 also corresponds to, e.g., a signal processing unit. An operation of the signal processing apparatus depicted in FIG. 1 will now be described as an embodiment of a signal processing method with reference to FIG. 2 to FIG. 7.

(2) Signal Processing Method According to Embodiment 1

Figure 2A:
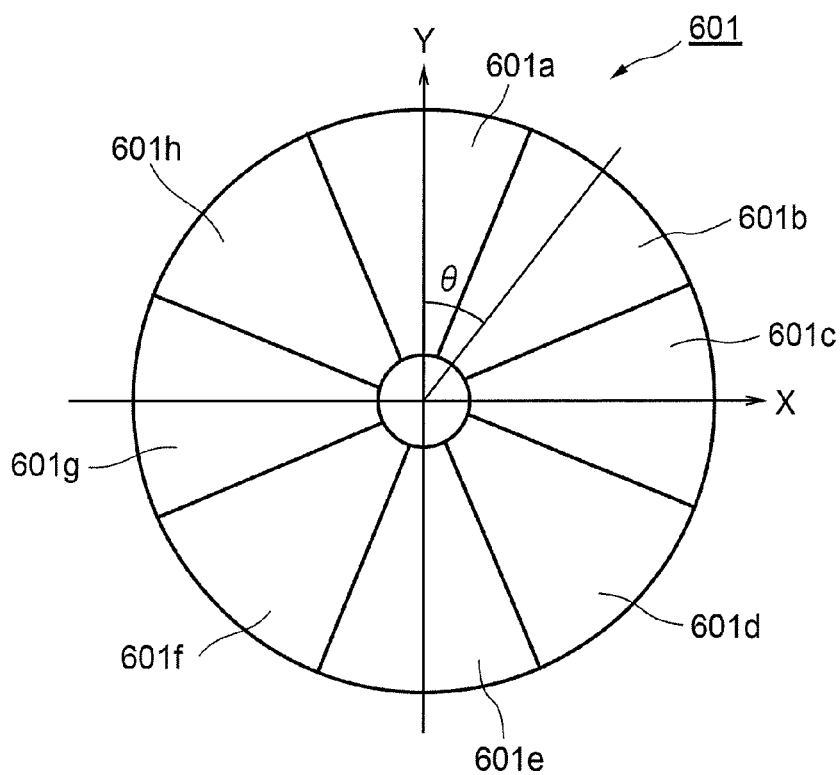
FIG. 2A to FIG. 2C are views showing a positional relationship between an inspection target pattern and a detector.
Figure 2B:
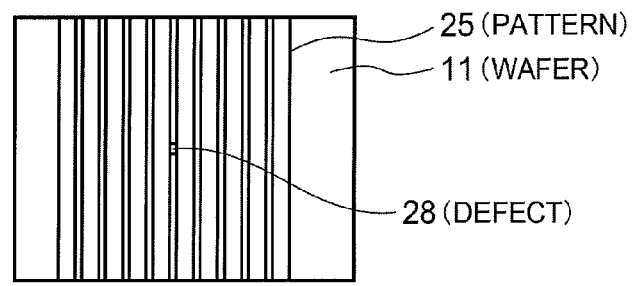
Figure 2C:
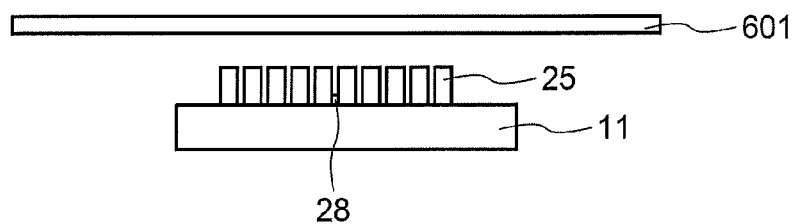

FIG. 2A to FIG. 2C are views showing a positional relationship between the inspection target pattern and the detector 6. Here, as the inspection target pattern, a line-and-space pattern (which will be simply referred to as an "L/pattern" hereinafter) will be taken. FIG. 2A shows a detector 601 as an example of the detector 6. Moreover, FIG. 2B shows an L/S pattern 25 formed on the wafer 11. Additionally, a defect 28 is present on a bottom surface of a space portion in the L/S pattern 25 (see FIG. 2C).

Figure 3A:
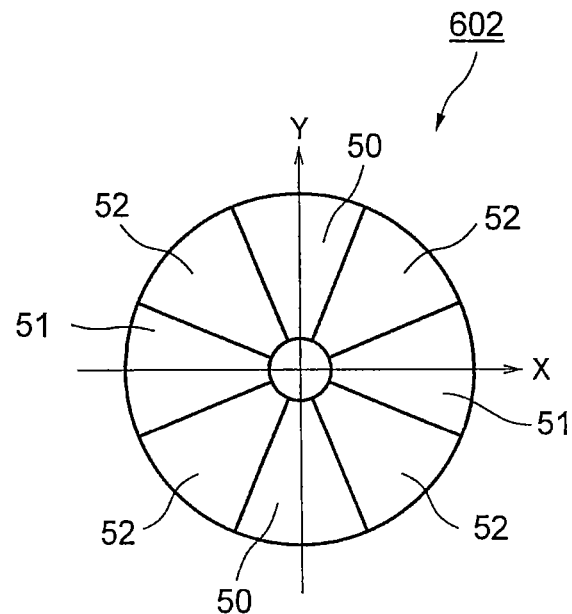
FIG. 3A to FIG. 3E are views showing other examples of the detector.
Figure 3B:
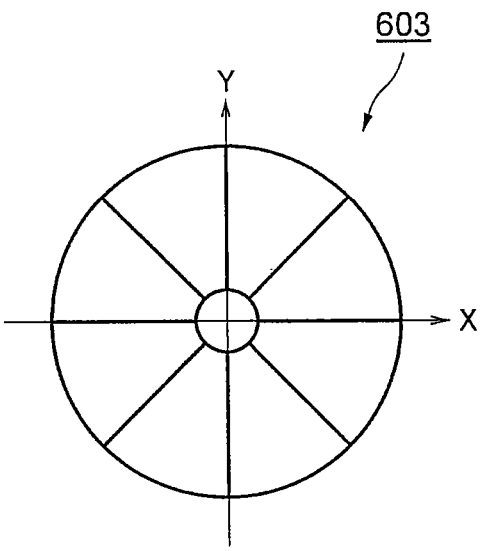
Figure 3C:
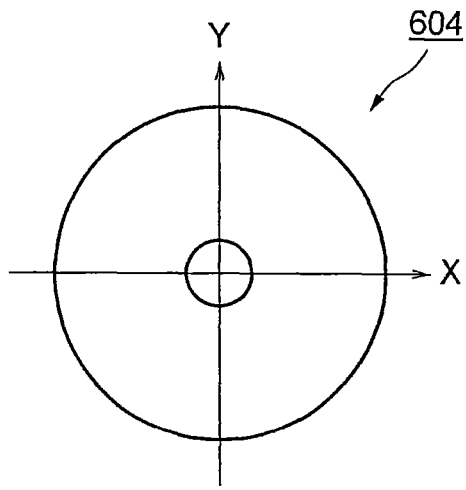
Figure 3D:
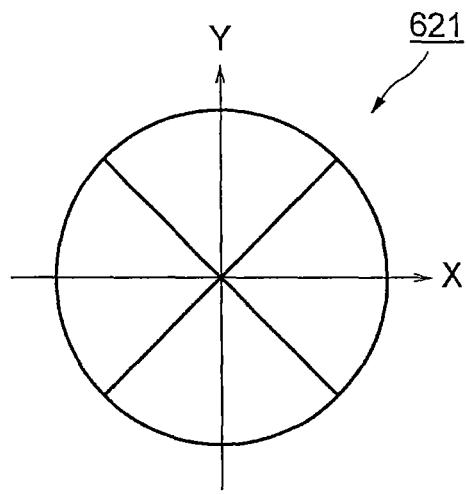
Figure 3E:
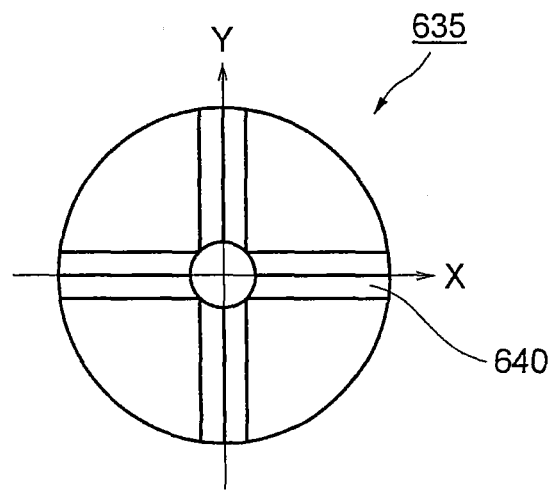
Figure 4:
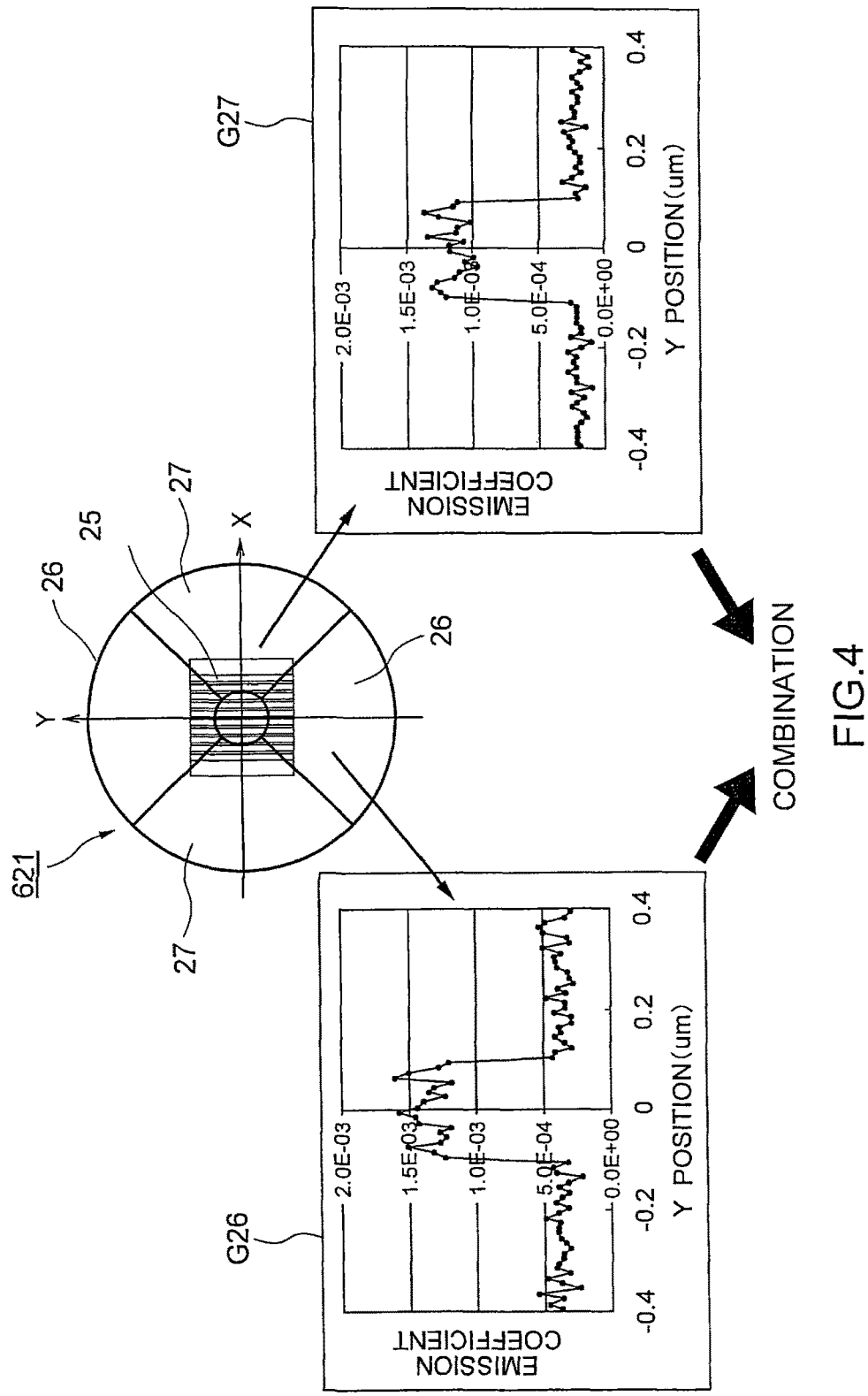
FIG. 4 is an explanatory view of a signal processing method according to Embodiment 1.
Figures 10A, 10B, 10C:
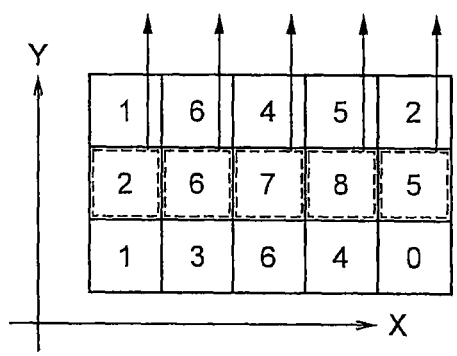
FIG. 10A to FIG. 10C are explanatory views of specific examples of filtering.

The detector 601 shown in FIG. 2A has regions 601a to 601h that are independently separated from each other so as to be N-time symmetrical (N is an even number equal to or above 4) with an optical axis of the electron beam 1 at the center above the pattern 25, and these regions 601a to 601h perform signal processing independently from each other. The regions 601a to 601h may be physically divided. FIG. 3A shows an example of one including regions physically divided. A detector 602 in FIG. 3A has detecting portions 50 to 52 divided so as to be eight-time symmetrical with the optical axis of the electron beam 1 at the center. These detecting portions 50 to 52 carry out signal processing independently from each other. In the example shown in FIG. 2A and FIG. 3A, eight-time symmetry (N=8) is adopted. FIG. 2C is a view showing the positional relationship between the wafer 11, the L/S pattern 25, and the detector 601 from the front side. It is to be noted that spacing between the wafer 11 and the detector 601 is omitted in FIG. 2C. Another example of the detector 6 will now be specifically described with reference to FIG. 3B to FIG. 3E. Detectors 603, 604, 621, and 635 shown in FIG. 3B to FIG. 3E are examples of four-time symmetry. Although the detectors 601 to 604 shown in FIG. 2A, FIG. 3A, FIG. 3B, and FIG. 3C are examples having an annular shape with the optical axis at the center, but the detectors are not restricted thereto, and they may have a discoid shape like a detector 621 shown in FIG. 3D as long as they are N-time symmetrical (N is an even number equal to or above 4) when they are provided at a position apart from the optical axis. Further, a region having sensitivity with respect to secondary charged particles on the surface of the detector may have a shape different from the detector shape mentioned above as long as it is N-time symmetrical (N is an even number equal to or above 4). For example, it is possible to adopt such a detector 635 including a detector 640 having a crisscross shape as shown in FIG. 3E. Here, assuming that a reference axis is an arbitrary direction within a wafer plane and $\theta$ is an angle between the reference axis and a direction along which the reflected electrons 4 enter a detector plane of the detector 601 as seen from the upper side of the detector 601 (i.e., the electron gun 16 side), the computer 13 executes signal processing in which intensity is defined in accordance with a function $f(\theta)$ of the angle $\theta$ with respect to each signal output from the detector 601, and combines processed signals, and thereby forms an SEM image. When this signal processing of the function $f(\theta)$ is used for a defect inspection, a difference image of an SEM image with a defective and of an SEM image of a normal portion with no defective may be temporarily created, and the signal processing may be executed with respect to this difference image. In this embodiment, as an example of the reference axis, a line direction of the L/S pattern 25 will be taken. Furthermore, in this embodiment, as shown in FIG. 2A, the detector 6 is arranged on the premise that the line direction of the L/S pattern 25 is the Y axis, a direction orthogonal to the Y axis is the X axis. In this case, the angle $\theta$ is an angle formed between the Y axis and the direction along which the reflected electrons 4 enter the detector plane of the detector 601 as seen from the upper side of the detector 601 (i.e., the electron gun 16 side). An example of the signal processing of the function $f(\theta)$ will now be specifically described with reference to FIG. 4. In the example of FIG. 4, a situation where a four-time symmetrical detector 621 divided into four parts will be taken. In FIG. 4, of the reflected electrons discharged from the L/S pattern 25, a graph G26 shows an intensity profile of a signal obtained by a detecting portion 26 arranged along the Y axis, and a graph G27 shows an intensity profile of a signal obtained by a detecting portion 27 arranged along the X axis. With respect to these signals, for example, the computer 13 executes strong filtering to the signal obtained by the detecting portion 26 and executes weak filtering to the signal obtained by the detecting portion 27. At this time, the filtering may not be executed to the signal obtained by the detecting portion 27 arranged along the X axis in some cases. As the function $f(\theta)$, a function that differs depending on a shape and an arrangement situation of the pattern formed on the wafer is used. Here, the filtering means signal processing for removing noise in some case, or means processing for amplifying and emphasizing a specific signal in another case. As typical examples of the former case, there are averaging processing of N×M pixels (N and M are natural numbers), median filtering, moving average processing performed along the Y axis or X axis direction, and others. FIG. 10A to FIG. 10C show specific examples. FIG. 10A to FIG. 10C all show a pixel group of a part of an image and gray level of each pixel. Here, numbers 0 to 8 represent gray level. For example, averaging processing of 3×5 pixels is filtering for substituting gray level of a pixel at the center by an average value of gray level of surrounding 3×5 pixels. Additionally, FIG. 10B shows an example of the median filtering. Here, an example of the medial filtering of 3×3 is shown. In this processing, gray levels of 3×3=9 pixels with a filtering target pixel at the center thereof are arranged in the ascending order and a value of the center (5 in this example) is counterchanged with a gray level of the filtering target pixel. Moreover, FIG. 10C shows an example of the moving average processing. Here, an example that the number of pixels to be averaged is 3 is shown. This is processing for averaging a filtering target pixel and pixels adjacent thereto. In such processings mentioned above, "filtering is strong" means that the number of pixels to be averaged is large in the case of averaging, and it means that the number of gray levels to be arranged is large in the case of median filtering. According to the signal processing method of this embodiment, when the filtering that defines the intensity in dependence on the function $f(\theta)$ of the angle $\theta$ is executed with respect to each of electrons detected by the detecting portions 26 and 27, S/N of signals from the pattern with a high aspect ratio can be enhanced as compared with a case that the filtering is collectively performed with respect to a sum total of signal amounts of all electrons detected by the detecting portions 26 and 27. In particular, when reflected electrons having high energy are selectively detected, signals from a space between the patterns having a high aspect ratio or from a deep position in a contact hole having a high aspect ratio can be detected with higher intensity. For example, to obtain information of a bottom of the pattern having an aspect ratio of 10 or above, detecting reflected electrons having energy of 20 keV or above is effective. For example, when the signal processing method according to this embodiment is applied to defect inspection, S/N of signals from foreign particles or a residual film present inside or on the bottom of the space of the L/S pattern having a high aspect ratio or inside or on the bottom of the contact hole having a high aspect ratio is improved, a difference from a normal portion can be thereby clarified, and hence defect detection performance can be improved. In a case of defect observation, visibility is improved with respect to defects present inside or on the bottom of the space of the L/S pattern having a high aspect ratio or inside or on the bottom of the contact hole having a high aspect ratio, and a shape of a foreign particle or a position of the same in the depth direction can be estimated. Further, when the signal processing method according to this embodiment is applied to metrology, S/N of signals reflecting a shape of a pattern, e.g., a side surface or a bottom surface of the space portion in the L/S pattern having a high aspect ratio or a side surface or a bottom surface of the contact hole having a high aspect ratio can be enhanced. Therefore, edge detection performance on the side surface or the bottom surface of the pattern having the high aspect ratio is improved, and a high dimension measurement accuracy can be obtained. In regard to depth (processing depth) measurement of the bottom surface of the space portion in the L/S pattern having a high aspect ratio or depth (processing depth) of the bottom surface of the contact hole portion having a high aspect ratio, since S/N of signals from the bottom portion is enhanced, and hence detecting a gray level difference in the processed portion enables accurate measurement. Signal processing of the function $f(\theta)$ will now be more specifically described while taking the eight-divided/eight-time symmetrical detector 602 depicted in FIG. 3A as an example.

With respect to the L/S pattern 25 as an inspection target pattern, for example, strong filtering is executed with respect to signals obtained by a detecting portion 50 along the Y axis, weak filtering is executed to signals obtained by a detecting portion 51 arranged along the X axis, and filtering having intermediate intensity between those of the detecting portion 50 and the detecting portion 51 is performed with respect to signals obtained by another detecting portion 52. At this time, no filtering may be performed with respect to signals obtained by the detecting portion 51 arranged along the X axis. Therefore, filter intensities in this case are as follows: filter intensity (the detecting portion 50)>filter intensity (the detecting portion 52)>filter intensity (the detecting portion 51). In this embodiment, the filtering with respect to signals obtained by the detecting portion 50 corresponds to, e.g., processing that is line-symmetric to the Y axis, and the filtering with respect to signals obtained by the detecting portion 51 corresponds to, e.g., processing that is line-symmetric to the X axis. As an example of signal processing associated with the angle $\theta$, in the case of such an L/S pattern 25 as depicted in FIG. 2, an example of the function $f(\theta)$ is as follows.

A function $f1(\theta)$ represents filtering for averaging Y pixel gray levels in a direction parallel to the line/space.

Y is determined as follows.

Y=A COS $\theta$+B ["A" and "B": constants]

(i) In regard to signals obtained by the detector in the range of $22.5° \geq \theta \geq 0°$, $202.5° \geq \theta \geq 157.5°$, and $360°>\theta \geq 337.5$, $\theta=\theta 1$ is determined.

(ii) In regard to signals obtained by the detector in the range of $67.5° \geq \theta \geq 22.5°$, $157.5° \geq \theta \geq 112.5°$, $247.5° \geq \theta \geq 202.5°$, and $337.5° \geq \theta \geq 292.5°$, $\theta=\theta 2$ is determined.

(iii) In regard to signals obtained by the detector in the range of $112.5° \geq \theta \geq 67.5°$ and $292.5° \geq \theta \geq 247.5°$, $\theta=\theta 3$ is determined.

"A" and "B" that achieve A COS $\theta_1$+B>A COS $\theta_2$+B>A COS $\theta_3$+B are selected. For example, in a case that three pixels are averaged in the Y axis direction with respect to signals obtained by the detector 50, two pixels are averaged with respect to signals obtained by the detector 52, and signals obtained by the detector 51 are not filtered, $\theta 1=0°$, $\theta 2=45°$, $\theta 3=90°$, "A"=3, and "B"=0 can be determined to perform desired filtering. At this time, when Y is not a natural number, rounding, cutting off numbers after the decimal point, or rounding out is performed. Further, as each of $\theta 1$ to $\theta 3$, a minimum rotational angle from the Y axis of each detector that acquires signals is used.

Figure 6A:
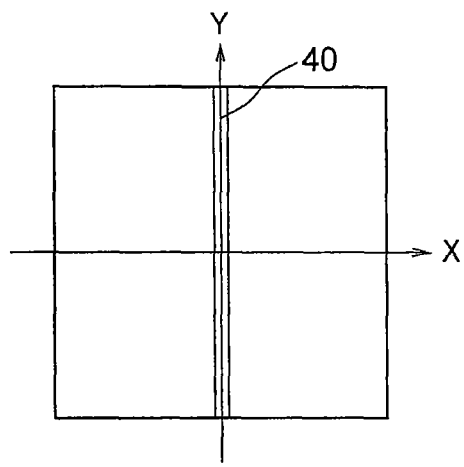
FIG. 6A through FIG. 6G are views showing specific examples of the inspection target pattern.
Figure 6B:
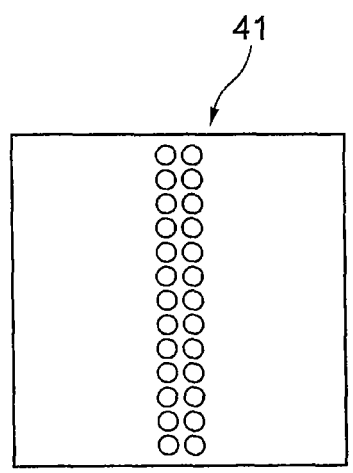
Figure 6C:
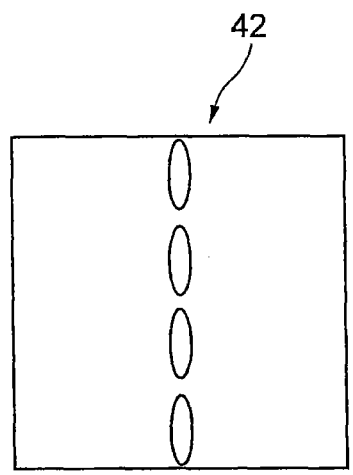
Figure 6D:
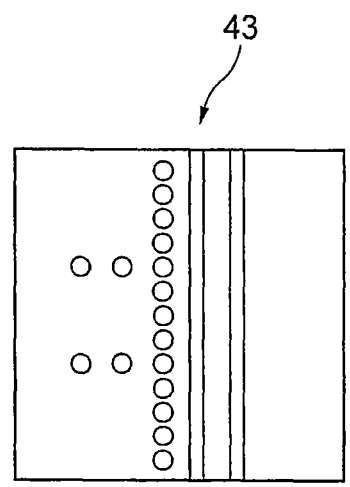
Figure 6E:
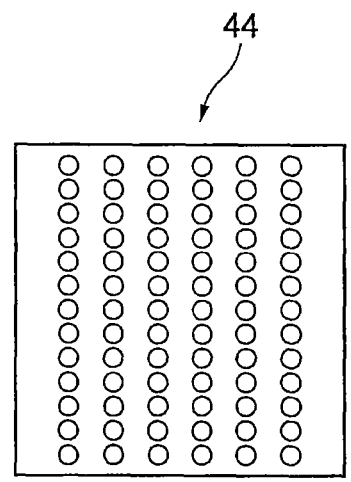
Figure 6F:
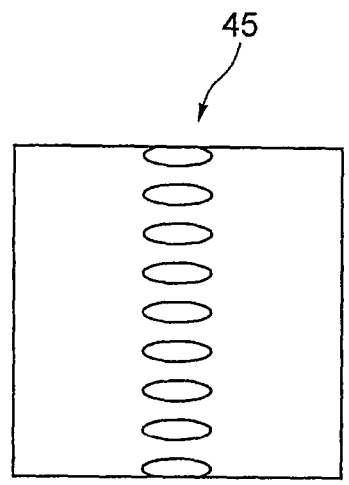
Figure 6G:
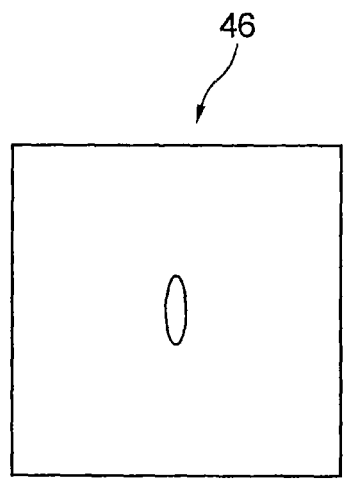

In a case of performing processing by the N-time symmetric detector, even if N is larger than 8, $\theta 1$, $\theta 2$, . . . are likewise determined, "A" pixels are averaged at a maximum, "B" pixels are averaged at a minimum, and any other detector performs processing having intermediate intensity. In the L/S pattern, signal processing $f1(\theta)$ that provides the strongest filtering when $\theta=0°$ and the weakest filtering when $\theta=90°$ can maximize S/N. The pattern as a signal processing target is not restricted to the L/S pattern 25, patterns other than a patter layout in which patterns are rotationally symmetric and arranged at equal intervals in the X direction and the Y direction (e.g., a layout that true circle contact holes are uniformly arranged at equal intervals in the X direction and the Y direction) can obtain the effect of the signal processing method according to this embodiment. For example, it is possible to adopt an isolated space pattern 40 shown in FIG. 6A, a single elliptic hole 46 shown in FIG. 6G, isolated hole type patterns 41 shown in FIG. 6B, elliptic hole patterns 42 and 45 shown in FIG. 6C and FIG. 6F, a space/hole type pattern 43 shown in FIG. 6D, and a hole type pattern 44 having intervals that differ in the X and Y directions shown in FIG. 6E. At this time, the Y axis (a reference axis) shown in FIG. 2A corresponds to a longitudinal direction and a long axis direction in the line pattern and the single elliptic hole, respectively, and corresponds to a direction providing a minimum pitch in the arrangement of any other pattern. In addition, the Y axis (a reference axis) shown in FIG. 2A corresponds to a longitudinal direction of the isolated space and a long axis direction of the ellipse in the examples of FIG. 6A and FIG. 6G, respectively, to a direction parallel to hole columns in the example of FIG. 6B, to a long axis direction of the elliptic shape in the example of FIG. 6C, to a short axis direction of the ellipse in the example of FIG. 6F, and to a direction parallel to hole columns with short intervals in a hole group in each of the examples of FIG. 6D, FIG. 6E, and FIG. 6F. This point can be likewise applied to later-described Embodiments 2 to 4.

(3) Signal Processing Method According to Embodiment 2

Figure 5A:
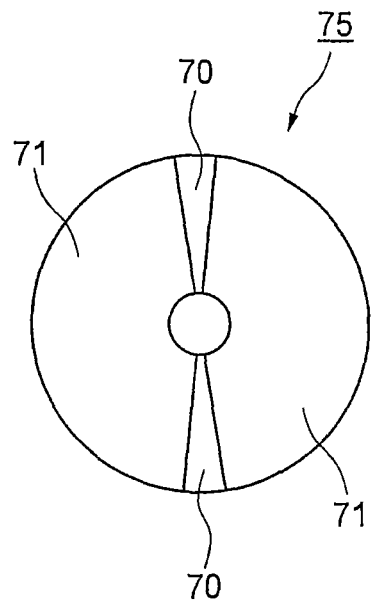
FIG. 5A and FIG. 5B are views for explaining a specific example of signal processing associated with energy of detected electrons.

One of characteristics according to the present embodiment lies in that several SEM images formed from electrons with different types of energy are acquired using an energy filter 7 (see FIG. 1) and signal processing of a different function f(θ) is performed with respect to each of these images. As a result, it is possible to obtain effects that are more advantageous than the signal processing method according to Embodiment 1 described above. In particular, it is better to perform strong filtering to an SEM image formed of high-energy reflected electron signals detected in a region of a detector arranged along a groove (e.g., a region 26 in FIG. 4, the detecting portion 50 in FIG. 3A). FIG. 5 show such an example. When an electron beam 1 has energy of 25 key, energy E of detected electrons is 25 keV≥E≥0 eV. At this time, image processing is executed as follows.

f2 (θ): filtering for averaging Y pixels in a direction along (parallel to) a longitudinal direction of L/S E≈25 keV, Y=M (M is a natural number not smaller than 2); 9°θ≥0°, 360°>θ≥351°, 189°≥θ≥171° (a detecting region 70 in FIG. 5A)

E≈25 keV, Y=1; 171°≥θ≥9°, 351°≥θ≥189° (a detecting region 71 in FIG. 5A)

Figure 5B:
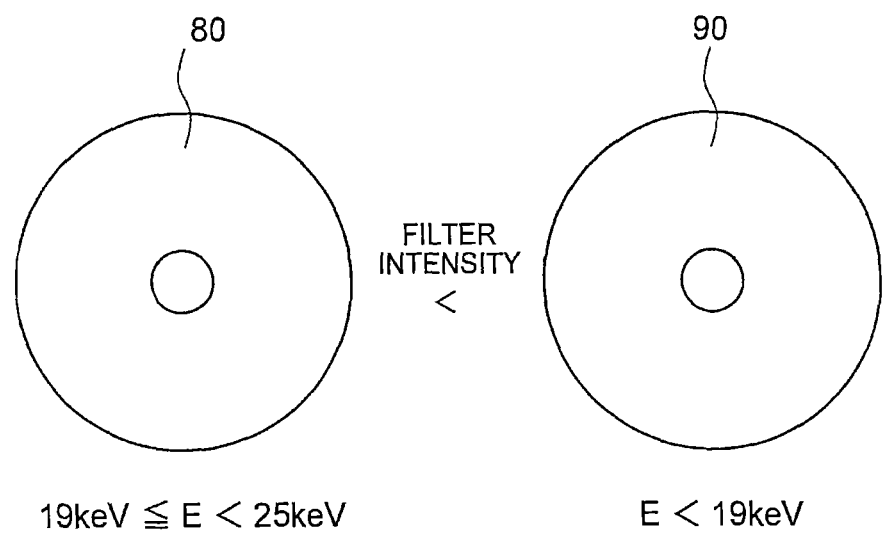

E<25 keV, Y=N (N is a natural number); all θ (FIG. 5B)

In regard to electrons having E<25 keV, as shown in FIG. 5B, it is still better to increase filter intensity as the energy is reduced. Here, a detector 80 captures electrons having relatively high energy (19 keV or above) in electrons of less than 25 keV, and a detector 90 captures electrons having energy that is less than 19 keV, which shows a relationship of filter intensity for each signal. To increase the filter intensity as the energy is reduced, images must be acquired with many different types of energy. Therefore, to save trouble, the electrons can be divided into electrons around 25 keV and electrons less than this value as described above.

Additionally, in regard to reflected electrons having low energy, e.g., less than 10 keV in the above example, it is often the case that S/N of a defect is very low, and hence acquisition of an image itself may not be performed in some cases.

(4) Signal Processing Method According to Embodiment 3

Figure 7A:
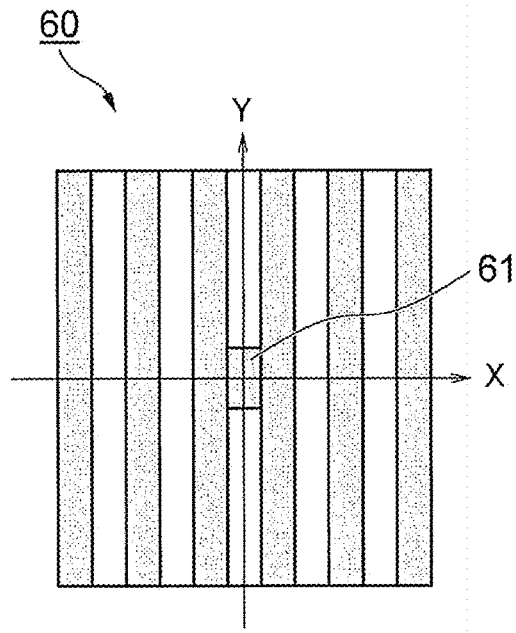
FIG. 7A to FIG. 7D are explanatory views of a signal processing method according to Embodiment 2.
Figure 7B:
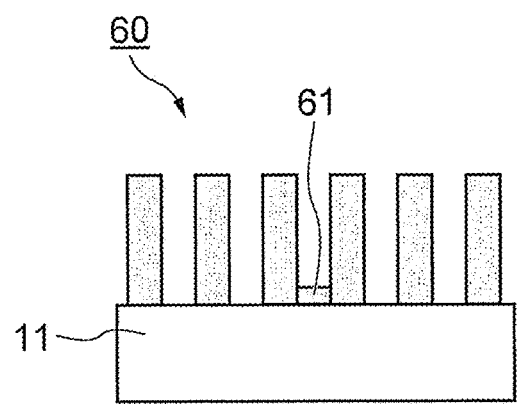

This embodiment provides a signal processing method for calculating a position of a defect in a depth direction in a pattern having a high aspect ratio from signals of reflected electrons detected by detectors separated or divided in a plurality of regions, the reflected electrons being detected separately in each region. FIG. 7A and FIG. 7B are a plan view and a front view of a pattern as an example of an inspection target pattern. An L/S pattern 60 shown in FIG. 7A and FIG. 7B is formed on a wafer 11, and a defect 61 is present on a bottom surface of a space.

Figure 7C:
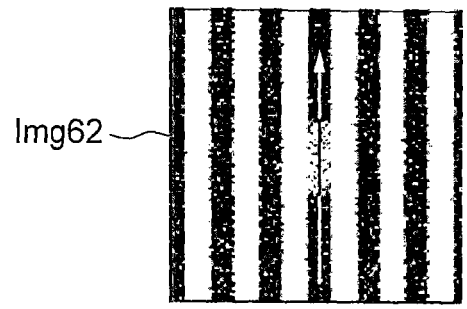
Figure 7D:
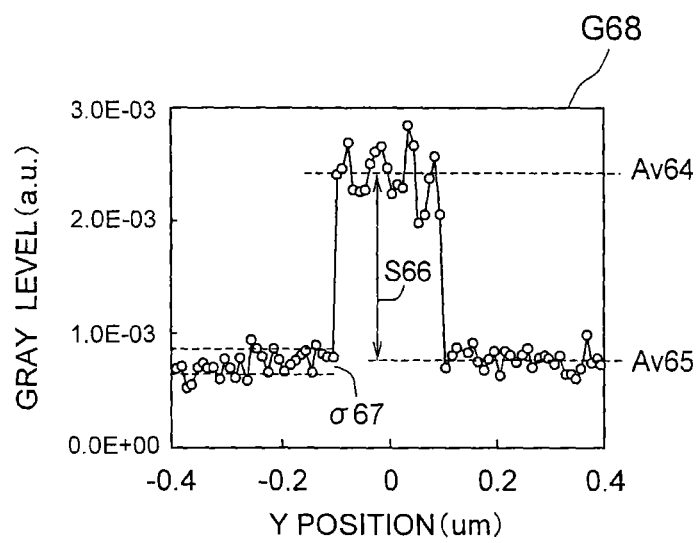

First, when acquiring an SEM image, an energy filter 7 arranged on a surface of a detector 6 is used to acquire a reflected electron image in accordance with each energy while changing intensity of the energy filter 7 in response to a control signal generated by a computer 13. Then, S/N of a defective portion is calculated with respect to the obtained reflected electron image for each energy. The S/N is calculated in accordance with, e.g., such a procedure as shown in FIG. 7C and FIG. 7D. When a short-circuit defect 61 is present on a groove bottom of the L/S pattern 60, its SEM image is like 1 mg 62 shown in, e.g., FIG. 7C. When a profile of a gradation is acquired with respect to this image along the Y axis so as to include the defective portion as indicated by an arrow in FIG. 7C, a graph like G68 shown in FIG. 7D can be obtained. A difference S66 between an average gradation Av64 of the defective portion and an average gradation Av65 of the groove bottom in this profile is defined as "Signal". On the other hand, as "Noise", a variation of the gradation of the groove bottom is used. To express the variation, a statistic such as a standard deviation σ is used. In this embodiment, a standard deviation σ67 in FIG. 7D is determined as a statistic representing a variation. The above-described S/N calculation is performed in accordance with each energy of detected reflected electrons, and energy dependence of the S/N is acquired.

Then, the calculated relationship between the reflected electron energy and the S/N is compared with prepared reference data, and a distribution shape which is the closest to the reference data is selected, whereby a position of a defect in the depth direction is calculated. FIG. 8A to FIG. 8F show specific examples of the reference data.

Figure 8A:
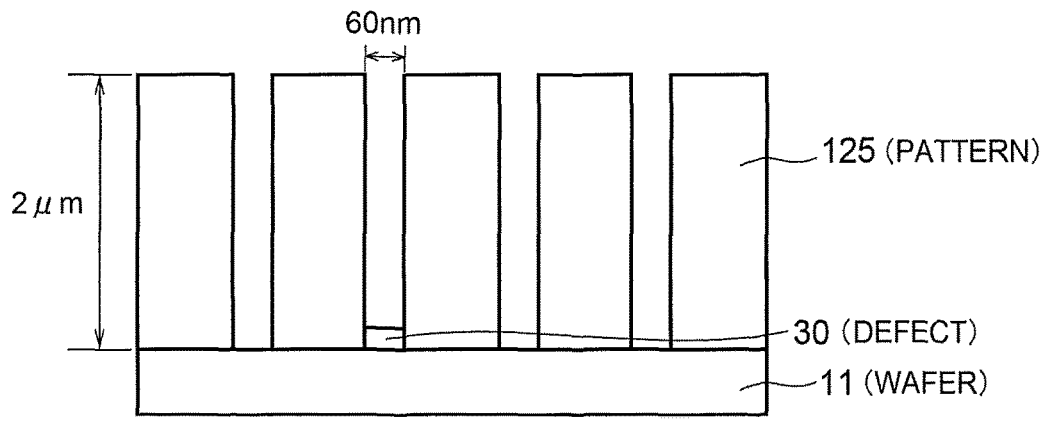
FIG. 8A to FIG. 8C are views showing specific examples of an L/S pattern with a high aspect ratio in which a defect is formed in a space.
Figure 8B:
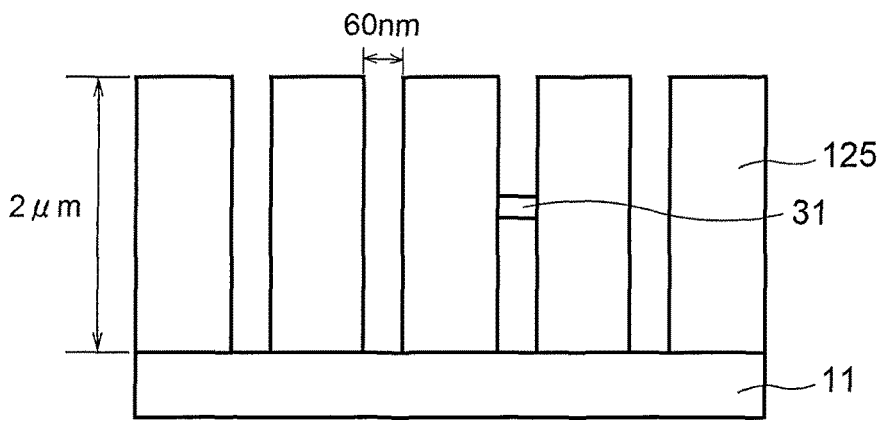
Figure 8C:
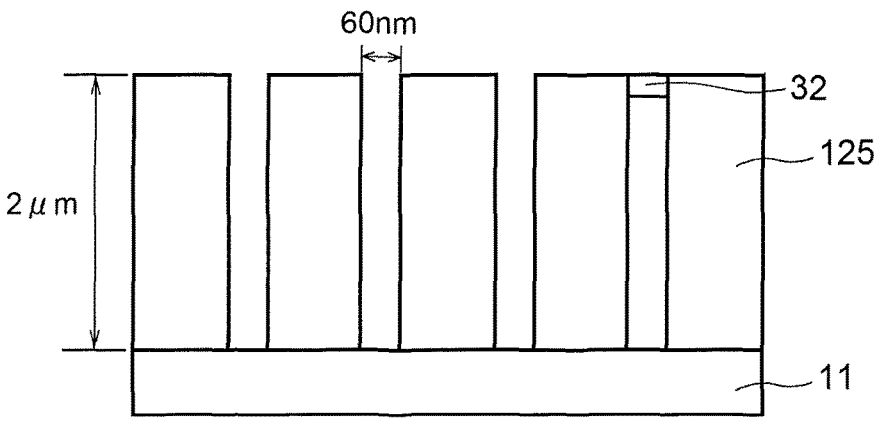
Figure 8D:
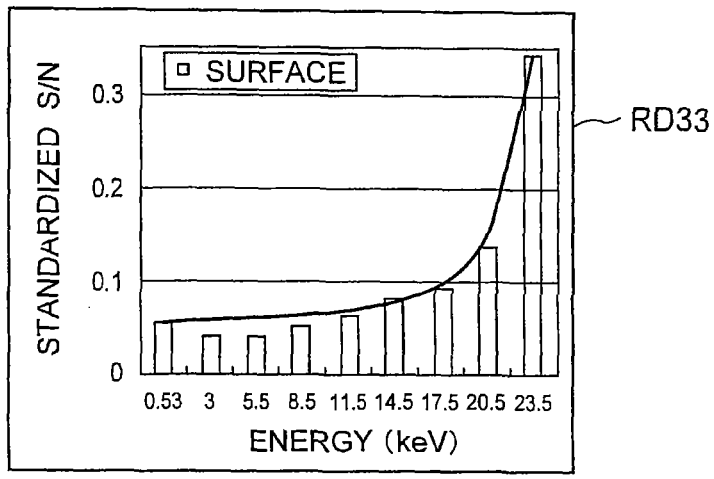
FIG. 8D through FIG. 8F are views showing specific examples of reference data prepared in advance in regard to a relationship between reflected electron energy and S/N.
Figure 8E:
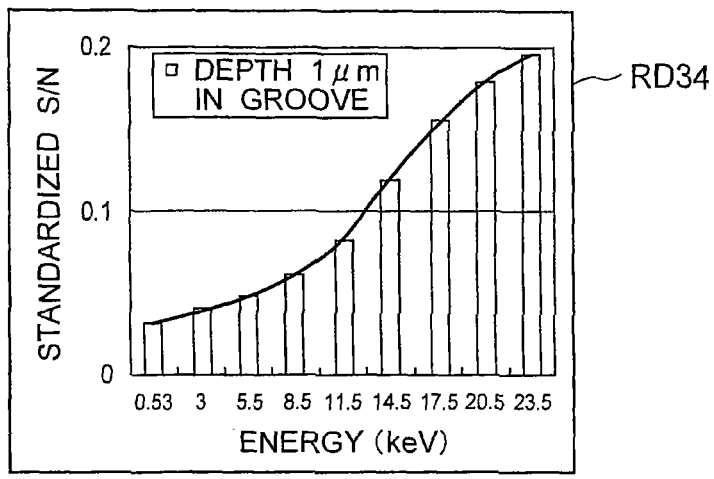
Figure 8F:
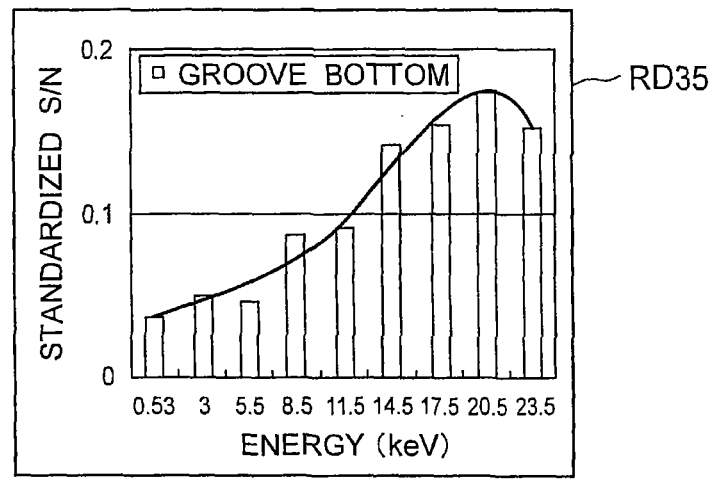

FIG. 8A to FIG. 8C show some examples of a pattern having a high aspect ratio for creating the reference data. A short circuit defect 30 is generated at a position on a groove bottom in a space in an L/S pattern 125 in FIG. 8A, a short circuit defect 31 is generated at a position in a groove in a space at the center in the depth direction in an L/S pattern 125 in FIG. 8B, and a short circuit defect 32 is generated at a position on a surface of a groove in an L/S pattern 125 in FIG. 8C. FIG. 8D is a graph RD33 showing an example of reference data for the relationship between the reflected electron energy and the S/N when a short circuit defect is present on a surface of a groove like the short circuit defect 30 in FIG. 8C. FIG. 8E is a graph RD34 showing an example of reference data for the relationship between the reflected electron energy and the S/N when a short circuit defect is present in a groove at the center in the depth direction like the short circuit defect 31 in FIG. 8B. Further, FIG. 8F is a graph RD35 showing an example of reference data for the relationship between the reflected electron energy and the S/N when a short circuit defect is present at an entrance of a groove like the short circuit defect 32 in FIG. 8C. In this embodiment, it can be understood that, when the relationship between the reflected electron energy and the S/N calculated in regard to the L/S pattern is compared with the respective pieces of reference data RD33 to RD35, the reference data RD35 has the closest distribution shape. Furthermore, the reference data RD35 is used to calculate a position of the short circuit defect 61 in the depth direction. As the reference data, it is possible to adopt data obtained by using a standard sample in advance to perform actual measurement or data obtained by simulation. In this embodiment, the pieces of reference data RD33 to RD35 correspond to, e.g., data representing energy dependence having intensity of a secondary charge particle signal.

(5) Signal Processing Method According to Embodiment 4

Figure 9A:
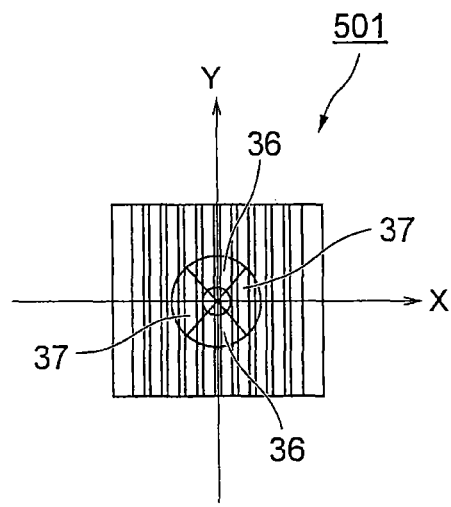
FIG. 9A through FIG. 9D are explanatory views of a signal processing method according to Embodiment 3.

FIG. 9A to FIG. 9D are explanatory views of a signal processing method according to the present embodiment. FIG. 9A shows a detector 501 that is rotationally symmetrically divided into four parts. In this embodiment, secondary electrons as charged particles having energy of 50 eV or below are detected using the detector 501, an obtained secondary electron signal is processed, and a position in a depth direction of a defect that is present in a pattern having a high aspect ratio is calculated. As an example of an inspection target pattern, the L/S pattern shown in each of FIG. 8A to FIG. 8C will be taken. In the pattern 125 shown in FIG. 8A to FIG. 8C, short circuit defects 30, 31, and 32 are generated at respective position, i.e., a groove bottom, the center of the groove, and an entrance of the groove.

Figure 9B:
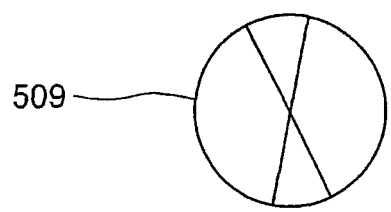
Figure 9C:
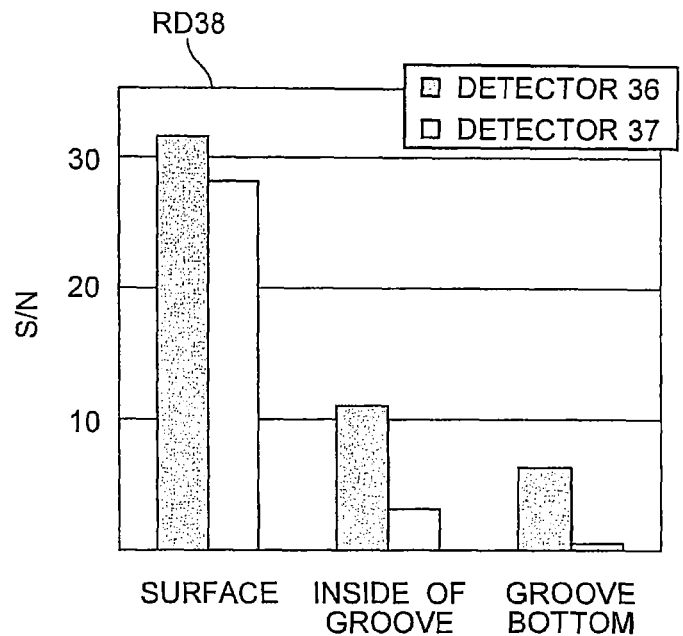
Figure 9D:
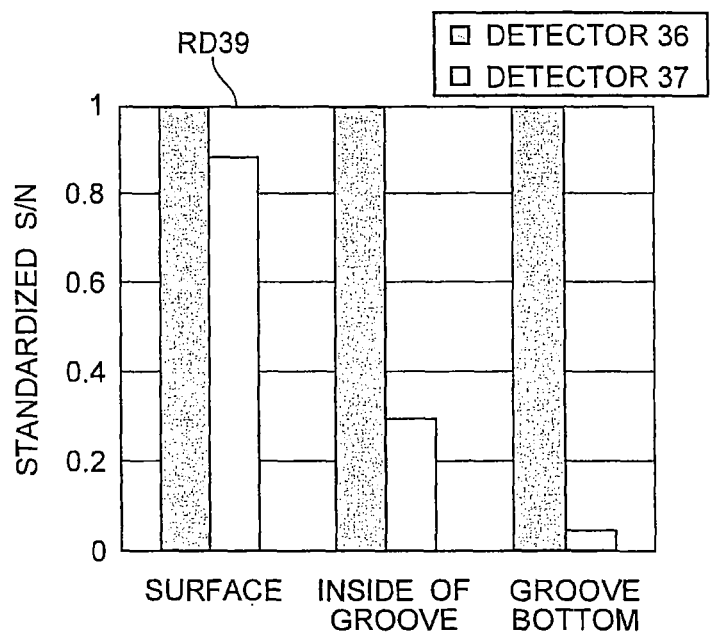

As shown in FIG. 9A, the detector 501 is configured to detect secondary electrons separately in a region 37 along the X axis and a region 36 along the Y axis. Although the detector 501 corresponds to a specific example of the secondary electron detector 5 in FIG. 1, the detector 6 in FIG. 1 may be used as the secondary electron detector. Here, the detector may be installed at a side portion apart from an optical axis in a column 15 instead of a position close to the optical axis, and secondary electrons may be deflected using an E×B apparatus like a Wien filter, thereby enabling detection. An example of the detector in this case is designated by reference numeral 509 in FIG. 9B. Here, the detector is not restricted to an annular shape, and it may have a discoid shape. Furthermore, as shown in FIG. 9B, an angle for division may differ, or an area ratio of divided regions may differ. In any case, the detector must be arranged so as to enable acquisition of secondary electron emission angle information. In this embodiment, 50 eV corresponds to, e.g., a predetermined threshold value. A graph RD38 of FIG. 9C shows an example of S/N in an SEM image obtained from the region 37 and S/N of a defect obtained from the region 36. Here, the S/N can be calculated in accordance with the same procedure as that in Embodiment 2. Moreover, a graph RD39 of FIG. 9D shows an example of each signal ratio calculated by standardizing the S/N obtained in the region 37 with the S/N obtained in the region 36. This signal ratio shows a characteristic tendency with respect to a defect depth position. The S/N obtained in the region 37 is reduced with respect to the region 36 as the depth position of the defect is deepened. This S/N may be calculated with respect to a difference image of an SEM image including a defective portion and an SEM image of a normal portion. Additionally, an image including an unknown defect is analyzed in the same manner, an obtained S/N ratio is compared with prepared reference data, and data having the highest coincidence degree is selected, thereby obtaining a depth of the unknown defect. The reference data may be obtained by actual measurement or may be obtained by simulation in advance. According to the signal processing methods of Embodiments 3 and 4, when there is a defect, its position in the depth direction can be calculated. Further, when there is no defect, or in regard to a region having no defect, a depth of a bottom surface in a high-aspect pattern, i.e., a processing depth can be measured.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and sprit of the inventions.

The invention claimed is:

1. A signal processing apparatus comprising:
a charged particle source configured to generate charged particles and irradiates a substrate with a charged particle beam;
an energy filter configured to selectively allows secondary charged particle having arbitrary energy intensity in the secondary charged particles emitted from the substrate to pass therethrough, based on an angle θ formed between a reference axis and a direction along which the secondary charged particles enter a detector plane, the reference axis being an arbitrary direction within a plane parallel to a surface of the substrate;
a detection unit which detects secondary charged particles having energy that is not greater than a predetermined threshold value among the secondary charged particles emitted in a state of being separated or divided in N regions from the substrate, where N is an even number of 4 or more, to output a signal regarding the detected secondary charged particles by each region; and
a signal processing unit configured to change an intensity of the energy filter while irradiating the charged particle beam, to calculate a S/N ratio in the regions in regard to the signal obtained by each region based on a result of changing the intensity of the energy filter, and to calculate a position of a defect in a depth direction or a depth of a bottom surface of the pattern based on the calculated S/N ratio.

2. The apparatus of claim 1,
wherein the signal processing unit is configured to use the same S/N in an arbitrary region and in another region to calculate the SIN ratio.

3. The apparatus of claim 1,
wherein the signal processing unit calculates the position of the defect in the depth direction or the depth of the bottom surface of the pattern by comparing the calculated S/N ratio with reference data prepared in advance.

4. The apparatus of claim 1,
wherein the N regions of the detector comprise:
at least a first region including a Y axis and a second region including an X axis, the Y axis direction being a longitudinal direction when the pattern is a line pattern, or being a direction providing a minimum pitch in arrangement of the pattern when the pattern is continuously arranged in a plurality of directions, and the X axis being a direction orthogonal to the Y axis direction within a plane parallel to the surface of the substrate.

\* \* \* \* \*